(12) United States Patent
Kurokawa

(10) Patent No.: US 9,330,919 B1
(45) Date of Patent: May 3, 2016

(54) METHOD FOR MANUFACTURING SUBSTRATE

(71) Applicant: TOYOTA JIDOSHA KABUSHIKI KAISHA, Toyota-shi, Aichi-ken (JP)

(72) Inventor: Yuto Kurokawa, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/853,114

(22) Filed: Sep. 14, 2015

(30) Foreign Application Priority Data

Oct. 8, 2014 (JP) .................................. 2014-207213

(51) Int. Cl.
| | |
|---|---|
| H01L 21/20 | (2006.01) |
| H01L 21/26 | (2006.01) |
| H01L 29/06 | (2006.01) |
| H01L 21/268 | (2006.01) |
| H01L 21/02 | (2006.01) |
| H01L 21/762 | (2006.01) |
| H01L 21/67 | (2006.01) |

(52) U.S. Cl.
CPC .......... *H01L 21/268* (2013.01); *H01L 21/0242* (2013.01); *H01L 21/0243* (2013.01); *H01L 21/02433* (2013.01); *H01L 21/67288* (2013.01); *H01L 21/76251* (2013.01)

(58) Field of Classification Search
USPC ........................................................ 438/795
See application file for complete search history.

(56) References Cited

U.S. PATENT DOCUMENTS

| | | | | |
|---|---|---|---|---|
| 2011/0256736 | A1* | 10/2011 | Cho et al. | ............ H01L 21/2007 438/795 |
| 2012/0018732 | A1* | 1/2012 | Aida et al. | ............ C30B 25/186 257/75 |
| 2013/0082358 | A1* | 4/2013 | Aida et al. | ............... C30B 29/20 257/618 |
| 2013/0161797 | A1* | 6/2013 | Aida et al. | ............... C30B 33/04 257/622 |
| 2014/0209012 | A1* | 7/2014 | Fujito et al. | ............. C30B 25/18 117/71 |
| 2015/0076505 | A1* | 3/2015 | Ke et al. | .................. H01L 33/22 257/76 |
| 2015/0292111 | A1* | 10/2015 | Grunder et al. | ....... C30B 29/406 257/615 |

FOREIGN PATENT DOCUMENTS

| | | |
|---|---|---|
| JP | 2010-165817 A | 7/2010 |
| JP | 2014-013801 A | 1/2014 |

* cited by examiner

*Primary Examiner* — Asok K Sarkar
(74) *Attorney, Agent, or Firm* — Oliff PLC

(57) ABSTRACT

A method for manufacturing a substrate is provided. The method includes irradiating a single crystal substrate with a beam of laser or charged particles while moving an irradiation point of the beam with respect to the single crystal substrate so that a trajectory of the irradiation point on a surface of the single crystal substrate describes a striped pattern of straight lines. Non-crystalline regions are formed in the single crystal substrate along the trajectory. The irradiation is repeated multiple times so that directions of the striped patterns are different from each other among the multiple times of irradiation. The repetition of the irradiation changes warpage of the single crystal substrate. All of directions of the straight lines described in the multiple times of irradiation are not parallel to any of directions of crystal axes of the single crystal substrate in a plane parallel to the surface.

4 Claims, 7 Drawing Sheets

METHOD FOR MANUFACTURING SUBSTRATE

CROSS-REFERENCE TO RELATED APPLICATION

This application claims priority to Japanese Patent Application No. 2014-207213 filed on Oct. 8, 2014, the contents of which are hereby incorporated by reference into the present application.

TECHNICAL FIELD

The present application relates to a method for manufacturing a substrate.

DESCRIPTION OF RELATED ART

Japanese Patent Application Publication No. 2010-165817 discloses a technique in which property-modified regions are formed in a sapphire substrate by irradiating the sapphire substrate with a laser beam, thereby to control warpage of the sapphire substrate.

BRIEF SUMMARY

When warpage of a substrate is controlled by irradiating the substrate with a laser beam as described in Japanese Patent Application Publication No. 2010-165817, there are cases where the warpage of the substrate cannot be controlled as intended. Therefore, the present specification provides a technique of accurately controlling warpage of a substrate.

The present specification provides a method for manufacturing a substrate. The method comprises irradiating a single crystal substrate with a beam of laser or charged particles while moving an irradiation point of the beam with respect to the single crystal substrate so that a trajectory of the irradiation point on a surface of the single crystal substrate describes a striped pattern of straight lines. Non-crystalline regions are formed in the single crystal substrate along the trajectory. The irradiation is repeated multiple times so that directions of the striped patterns are different from each other among the multiple times of irradiation. The repetition of the irradiation changes warpage of the single crystal substrate. In the irradiation of multiple times, all of directions of the straight lines described in the multiple times of irradiation are not parallel to any of directions of crystal axes of the single crystal substrate in a plane parallel to the surface.

The substrate manufactured by the above method may be a substrate composed solely of a single crystal substrate, or may alternatively be a multi-layer substrate including a single crystal substrate and other layers stacked on the single crystal substrate.

The inventors of the present application has discovered that there is a difference in an amount of warpage change between a case where straight lines of a trajectory of an irradiation point are parallel to crystal axes and a case where the straight lines are not parallel to any of the crystal axes. Therefore, if the trajectory of the irradiation point includes a direction parallel to a crystal axis and a direction not parallel to any crystal axes, the amount of warpage change varies depending on the directions, and the warpage of the substrate cannot be accurately controlled. In contrast, as described above, when none of the directions of the straight lines described in the multiple times of irradiation are parallel to any of the directions of the crystal axes of the single crystal substrate in the plane parallel to the surface of the single crystal substrate, the amount of warpage change can be controlled with stability.

DETAILED DESCRIPTION OF INVENTION

Figure 1:
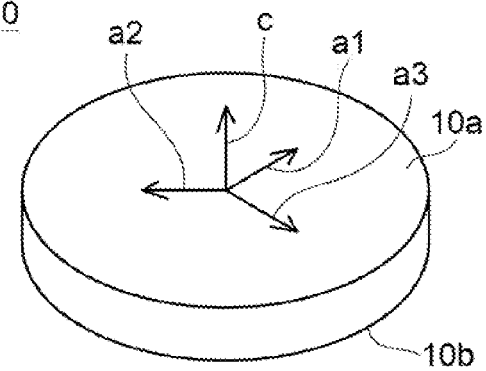
FIG. 1 is a perspective view of a support plate 10.

In a method for manufacturing a semiconductor device according to an embodiment, a semiconductor wafer is adhered to a support plate to reinforce the semiconductor wafer, and the reinforced semiconductor wafer is subjected to processing. FIG. 1 shows a support plate 10 used for the method of this embodiment. The support plate 10 is composed of a monocrystalline sapphire. Sapphire has a hexagonal crystal structure. The support plate 10 has a disk shape. A thickness direction of the support plate 10 corresponds to a c-axis of the hexagonal crystal. Therefore, an upper surface 10a and a lower surface 10b of the support plate 10 correspond to c-planes of the hexagonal crystal. That is, an a1-axis, an a2-axis, and an a3-axis of the hexagonal crystal are parallel to the upper surface 10a and the lower surface 10b. An angle between the a1-axis and the a2-axis is 120°, an angle between the a2-axis and the a3-axis is 120°, and an angle between the a3-axis and the a1-axis is 120°. In this embodiment, the support plate 10 (i.e., sapphire) has a linear expansion coefficient of 5.2 ppm/K. The support plate 10 is substantially transparent. Hereinafter, a method for manufacturing a semiconductor device using the support plate 10 is described.

(Non-Crystalline Region Forming Process)

Figure 2:
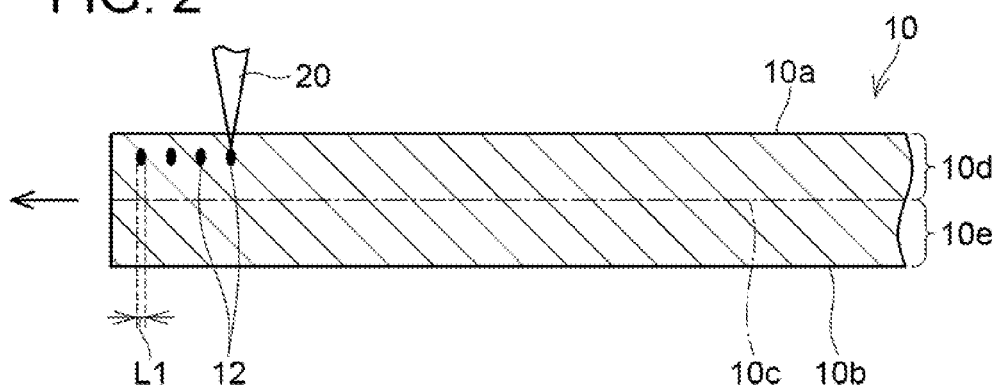
FIG. 2 is a cross-sectional view of the support plate 10 during a non-crystalline region forming process.

First, as shown in FIG. 2, the upper surface 10a of the support plate 10 is irradiated with a laser beam 20. In this embodiment, a focal point of the laser beam 20 is formed in the support plate 10 by using an optical system. More specifically, the focal point of the laser beam 20 is formed in a region 10d that is closer to the upper surface 10a than a center portion 10c of the support plate 10 in the thickness direction of the support plate 10. The laser beam 20 is emitted from a short-pulse laser irradiation device such as a femtosecond laser device. The laser beam 20 is intermittently applied to the upper surface 10a at predetermined time intervals, each of which is longer than a femtosecond. While being intermittently irradiated with the laser beam 20, the support plate 10 is moved with respect to the laser irradiation device. The support plate 10 is moved in a direction along the upper surface 10a thereof.

Figure 3:
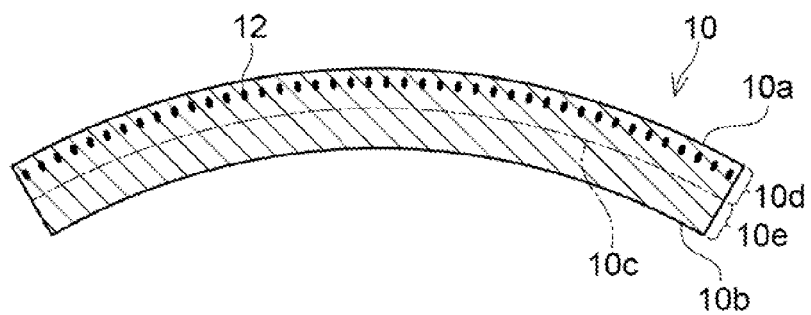
FIG. 3 is a cross-sectional view of the support plate 10 after the non-crystalline region forming process.

When the support plate 10 is irradiated with the laser beam 20 as described above, crystalline alignment of the support plate 10 is disordered in positions of the focal point of the laser beam 20, and non-crystalline regions 12 (i.e., crystal defects) are formed. Since the support plate 10 is intermittently irradiated with the laser beam 20 while being moved, the non-crystalline regions 12 are formed in the support plate 10 at regular intervals along a trajectory of irradiation point of the laser beam 20. When the non-crystalline regions 12 are formed, regions that are non-crystallized expand. Since the non-crystalline regions 12 are formed in the region 10d closer to the upper surface 10a, when the non-crystalline regions 12 are formed as described above, the region 10d closer to the upper surface 10a expands while a region 10e closer to the lower surface 10b does not expand. Thus, as shown in FIG. 3, the support plate 10 warps convexly toward an upper surface 10a side. As shown in FIG. 3, the non-crystalline regions 12 are formed at sufficient intervals so that adjacent non-crystalline regions 12 are not joined to each other.

Figure 4:
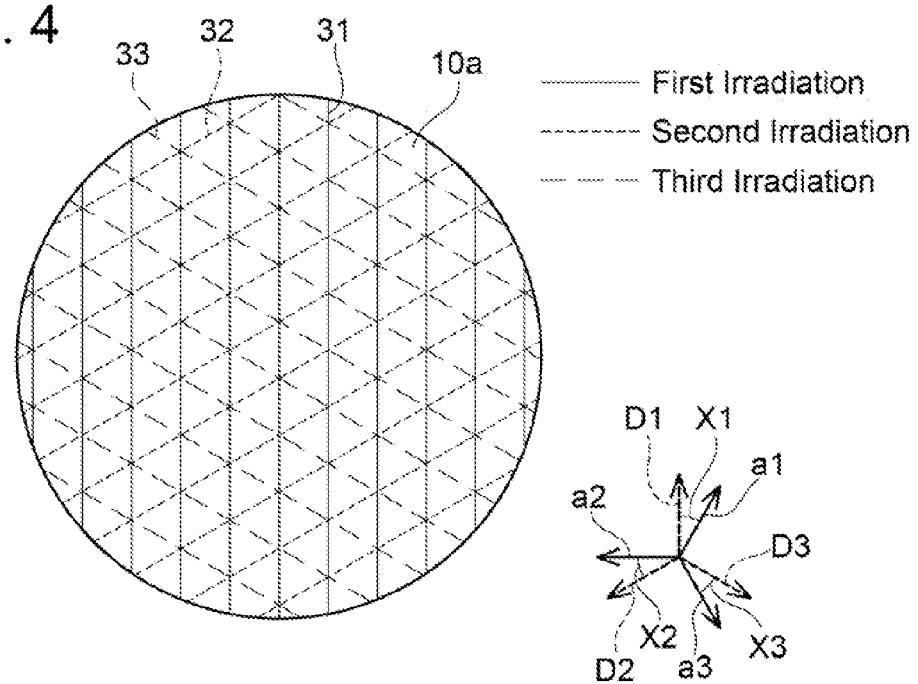
FIG. 4 is a diagram for explaining trajectories 31 to 33 according to an embodiment.

The above-mentioned irradiation of the laser beam 20 is executed three times. FIG. 4 shows trajectories of irradiation points of the laser beam 20 in the first to third irradiations of the laser beam 20. In the first irradiation, the irradiation point of the laser beam 20 is moved with respect to the support plate 10 along a direction D1 shifted by an angle X1 (30° in this embodiment) counterclockwise with respect to a direction of the crystal axis a1 in a plane parallel to the upper surface 10a. The irradiation point of the laser beam 20 is moved so as to scan the upper surface 10a of the support plate 10 multiple times. Thereby, the trajectory of the irradiation point of the laser beam 20 in the first irradiation describes a striped pattern of straight lines as shown by a trajectory 31 in FIG. 4. Thus, in the first irradiation, a plurality of the non-crystalline regions 12 is formed along the trajectory 31. In the second irradiation, the irradiation point of the laser beam 20 is moved with respect to the support plate 10 along a direction D2 shifted by an angle X2 (30° in this embodiment) counterclockwise with respect to a direction of the crystal axis 2a in the plane parallel to the upper surface 10a. The irradiation point of the laser beam 20 is moved so as to scan the upper surface 10a of the support plate 10 multiple times. Thereby, the trajectory of the irradiation point of the laser beam 20 in the second irradiation describes a striped pattern of straight lines as shown by a trajectory 32 in FIG. 4. Thus, in the second irradiation, the plurality of non-crystalline regions 12 is formed along the trajectory 32. In the third irradiation, the irradiation point of the laser beam 20 is moved with respect to the support plate 10 along a direction D3 shifted by an angle X3 (30° in this embodiment) counterclockwise with respect to a direction of the crystal axis a3 in the plane parallel to the upper surface 10a. The irradiation point of the laser beam 20 is moved so as to scan the upper surface 10a of the support plate 10 multiple times. Thereby, the trajectory of the irradiation points of the laser beam 20 in the third irradiation describes a striped pattern of straight lines as shown by a trajectory 33 in FIG. 4. Thus, in the third irradiation, the plurality of non-crystalline regions 12 is formed along the trajectory 33.

The irradiation of the laser beam 20 shown in FIG. 4 can cause uniform warpage in the support plate 10. A reason is described hereinafter. A size of each non-crystalline region 12, that is formed by straight lines of the trajectory of the laser beam irradiation point, varies depending on whether or not the straight lines of the trajectory are parallel to any crystal axes. That is, when the straight lines of the trajectory are parallel to any of the crystal axes, long non-crystalline regions are formed along the trajectory. That is, a length L1 of each non-crystalline region 12 shown in FIG. 2 is long. In this case, warpage that occurs in the support plate is small in a direction along the straight lines of the trajectory. On the other hand, when the straight lines of the trajectory are not parallel to any of the crystal axes, the size of each non-crystalline region 12 is small (i.e., the length L1 is short). In this case, the warpage that occurs in the support plate is large in the direction along the straight lines of the trajectory.

Figure 5:
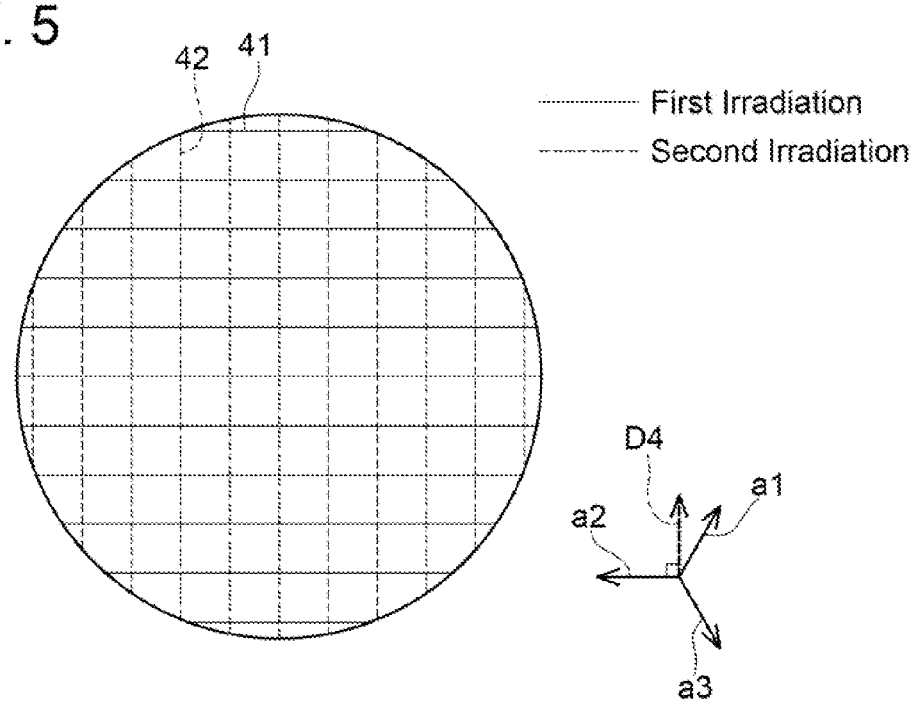
FIG. 5 is a diagram for explaining trajectories 41 and 42 according to a comparative example.
Figure 6:
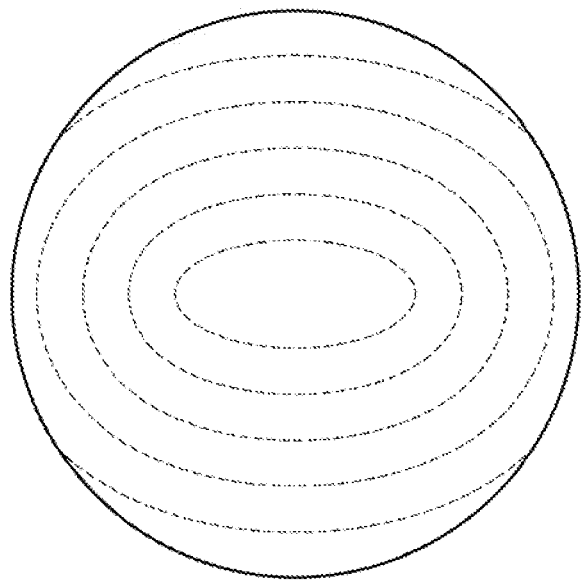
FIG. 6 is a diagram showing contour lines on an upper surface 10a of the support plate 10 warped according to a method of the comparative example.

FIG. 5 shows trajectories 41 and 42 of the laser beam irradiation point according to a comparative example. In FIG. 5, laser beam irradiation is performed two times on the support plate 10. In the first laser beam irradiation, the irradiation point of the laser beam 20 is moved along the crystal axis a2. In the second irradiation, the irradiation point of the laser beam 20 is moved along a direction D4 perpendicular to the crystal axis a2 (i.e., a direction non-parallel to the crystal axes at, a2, and a3). In this method, warpage of the support plate 10 is small in a direction along the crystal axis a2, but is large in the direction D4. Therefore, as shown in FIG. 6, the support plate 10 warps in an elliptical shape.

Figure 7:
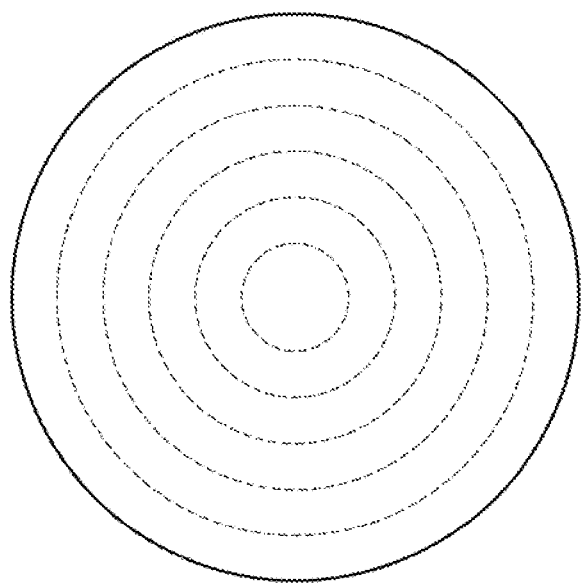
FIG. 7 is a diagram showing contour lines on the upper surface 10a of the support plate 10 warped according to a method of the embodiment.

In contrast to the comparative example, when the laser beam 20 is irradiated as shown in FIG. 4, none of the straight lines of the trajectories 31 to 33 are parallel to the crystal axes a1 to a3. Therefore, the warpage of the support plate 10 is large in all the directions D1 to D3 along the trajectories 31 to 33. That is, warpage occurs substantially uniformly in the directions D1 to D3. As a result, the support plate 10 warps into a complete round shape as shown in FIG. 7. In particular, in the present embodiment, as shown in FIG. 4, the respective angles X1 to X3 between the directions D1 to D3 of the trajectories and the crystal axes a1 to a3 are substantially equal to each other, and thus amounts of warpage in the directions D1 to D3 are equal to each other. Therefore, warpage is distributed in such a manner that the distribution is all the more close to a complete round shape. It is most preferable that the angles X1 to X3 are equal to each other. A difference between these angles is preferably within ±5°. By setting the difference between the angles X1 to X3 within ±5°, it is possible to cause the support plate 10 to warp in such a manner that the distribution of warpage is substantially close to a complete round shape.

(Adhering Process)

Figure 8:
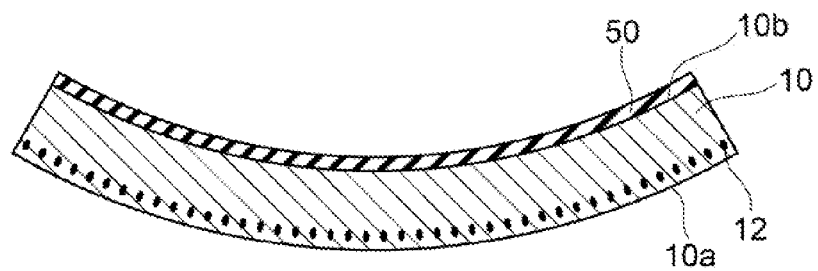
FIG. 8 is a cross-sectional view of the support plate 10 after an adhesive agent 50 is applied to the support plate 10.

Next, adhering of a semiconductor substrate to the warped support plate 10 by using an adhesive agent is described. First, as shown in FIG. 8, an adhesive agent 50 is applied to the lower surface 10b of the support plate 10. The adhesive agent 50 is a thermoplastic polyimide resin. After the adhesive agent 50 is applied to the lower surface 10b of the support plate 10, the support plate 10 is heated (subjected to bake treatment). Thereby, solvent is vaporized from the adhesive agent 50 to semi-cure the adhesive agent 50. Next, heat treatment to imidize the adhesive agent is performed.

Figure 9:
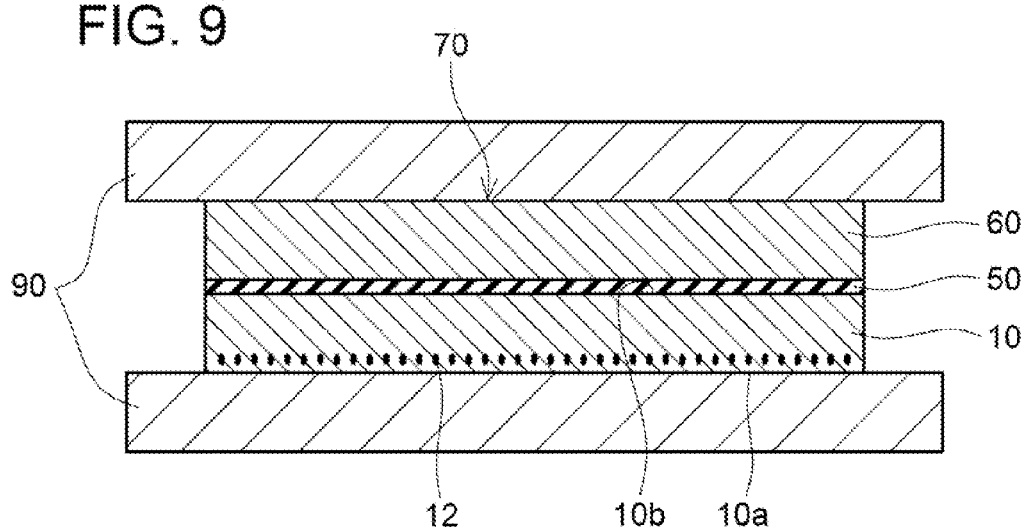
FIG. 9 is a cross-sectional view of a multi-layer substrate 70.

Next, the support plate 10 is placed in a furnace for adhesion (not shown), and thereafter, a semiconductor substrate 60 is disposed on the adhesive agent 50. The semiconductor substrate 60 is composed of silicon. The semiconductor substrate 60 (i.e., silicon) has a linear expansion coefficient of 3.4 ppm/K. That is, the linear expansion coefficient of the semiconductor substrate 60 is smaller than the linear expansion coefficient of the support plate 10. As shown in FIG. 9, a multi-layer substrate 70 including the support plate 10, the adhesive agent 50, and the semiconductor substrate 60 is pressurized in its thickness direction by using a pressing machine 90 while the multi-layer substrate 70 is also being heated. This pressurization planarizes the multi-layer substrate 70. Since the warped support plate 10 is pressed to be flat, stress is generated in the support plate 10. A reduced-pressure atmosphere is formed around the multi-layer substrate 70. The adhesive agent 50 is softened by the heating. The semiconductor substrate 60 is closely adhered to the softened adhesive agent 50 by the pressurization. The reduced pressure suppresses voids from being generated in the adhesive agent 50. Next, the multi-layer substrate 70 is gradually cooled. When the multi-layer substrate 70 has been cooled down to a temperature lower than a glass transition point of the adhesive agent 50, the adhesive agent 50 is solidified. Thus, the semiconductor substrate 60 and the support plate 10 are fixed to each other. The cooling is continued until the multi-layer substrate 70 has been cooled down to a room temperature.

When the multi-layer substrate 70 is cooled, the support plate 10 and the semiconductor substrate 60 act to shrink. Since the linear expansion coefficient of the support plate 10 is larger than the linear expansion coefficient of the semiconductor substrate 60, the support plate 10 acts to shrink at a greater degree than the semiconductor substrate 60 does. Therefore, the multi-layer substrate 70 acts to warp convexly toward the semiconductor substrate 60 side. However, since the multi-layer substrate 70 is being held by the pressing machine 90, no warpage occurs in the multi-layer substrate 70. Therefore, stress that causes the multi-layer substrate 70 to warp convexly toward the semiconductor substrate 60 side is generated in the multi-layer substrate 70. As described above, the stress has already been generated in the support plate 10 when the warped support plate 10 was pressed. This stress is stress that causes the support plate 10 to warp in a direction opposite to the stress caused by a difference in linear expansion coefficient. Therefore, the stress in the support plate 10 cancels the stress caused by the difference in linear expansion coefficient.

Figure 10:
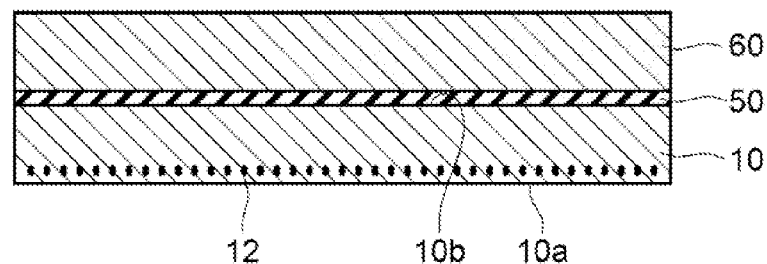
FIG. 10 is a cross-sectional view of the multi-layer substrate 70.

When the multi-layer substrate 70 has been cooled down to the room temperature, the multi-layer substrate 70 is taken out of the furnace. At when the multi-layer substrate 70 has been cooled down to the room temperature, the stress inside the support plate 10 and the stress caused by the difference in linear expansion coefficient have been substantially completely canceled with each other. Therefore, the multi-layer substrate 70 taken out of the furnace is almost completely flat as shown in FIG. 10. Thus, according to this method, the multi-layer substrate 70 that is flat can be obtained.

Since the support plate 10 was warped in the complete round shape in the non-crystalline region forming process, warpage of the multi-layer substrate 70 is uniformly corrected regardless of the directions in the adhering process. Thus, the multi-layer substrate 70 that is all the more flat can be obtained.

After the flat multi-layer substrate 70 is formed as described above, the semiconductor substrate 60 is subjected to various processes. For example, a surface of the semiconductor substrate 60 is ground to reduce the thickness of the semiconductor substrate 60. Thereafter, a diffusion layer is formed in the semiconductor substrate 60, and electrodes and the like are formed on the surface of the semiconductor substrate 60, thereby to form structures of semiconductor elements. Next, the adhesive agent 50 is irradiated with a laser beam through the support plate 10 to reduce adhesive strength of the adhesive agent 50. Thereafter, the semiconductor substrate 60 is removed from the support plate 10. At this time, since a film or the like to reduce warpage is not provided on a surface of the support plate 10, the adhesive agent 50 can be efficiently irradiated with the laser beam. Thereafter, the semiconductor substrate 60 is diced to complete individual semiconductor devices. The support plate 10 removed from the semiconductor substrate 60 again warps as shown in FIG. 3. The support plate 10 can be reused for processing of another semiconductor substrate 60.

As described above, according to this method, the support plate 10 is caused to warp in advance. Then, the warpage of the support plate 10 can cancel the warpage caused by the difference in linear expansion coefficient between the support plate 10 and the semiconductor substrate 60. Therefore, it is possible to obtain the flat multi-layer substrate 70. In particular, according to the above-described method, since the support plate 10 is uniformly warped in a complete round shape, the warpage of the multi-layer substrate 70 can be uniformly corrected with no local concentration of warpage. Therefore, the multi-layer substrate 70 that is all the more flat can be obtained.

The size of each non-crystalline region 12 is preferably as small as possible. By having the size of each non-crystalline region 12 be small, the laser beam can be prevented from being scattered by the non-crystalline regions 12 when the support plate 10 is removed from the semiconductor substrate 60. For the same reason as above, the intervals at which the non-crystalline regions 12 are formed are preferably as large as possible within a range that allows the support plate 10 to warp.

Figure 11:
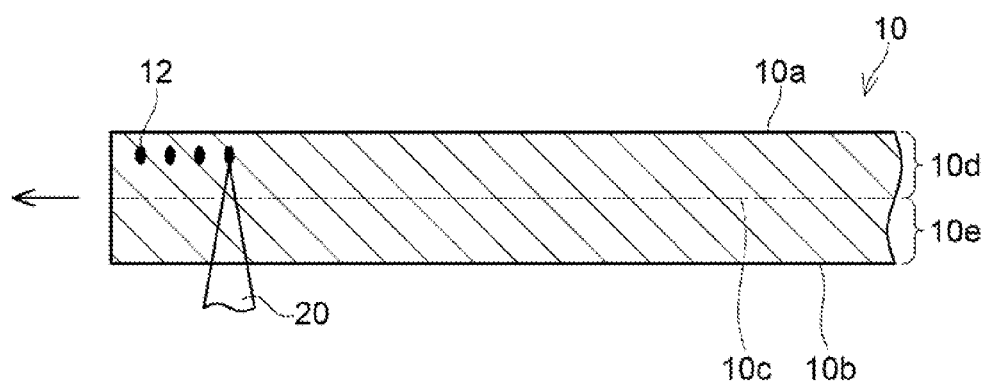
FIG. 11 is a cross-sectional view of the support plate 10 during a non-crystalline region forming process according to a modification.

In the above-described embodiment, as shown in FIG. 2, the surface (i.e., the upper surface 10a) of the support plate 10 on a side where the non-crystalline regions 12 are formed is irradiated with the laser beam 20. Alternatively, as shown in FIG. 11, a surface (i.e., the lower surface 10b) of the support plate 10 on a side opposite to the side where the non-crystalline regions 12 are formed may be irradiated with the laser beam 20.

In the above-described embodiment, the semiconductor substrate 60 is adhered to the lower surface 10b (i.e., the surface farther from the non-crystalline regions 12) of the support plate 10. Alternatively, when the linear expansion coefficient of the semiconductor substrate 60 is larger than the linear expansion coefficient of the support plate 10, the semiconductor substrate 60 may be adhered to the upper surface 10a (i.e., the surface closer to the non-crystalline regions 12) of the support plate 10. Thus, warpage of the multi-layer substrate can be corrected.

In the above-described embodiment, the adhesive agent 50 is applied to the surface of the support plate 10, and thereafter, the support plate 10 is adhered to the semiconductor substrate 60. Alternatively, the adhesive agent 50 may be applied to the surface of the semiconductor substrate 60, and thereafter, the semiconductor substrate 60 may be adhered to the support plate 10.

Figure 12:
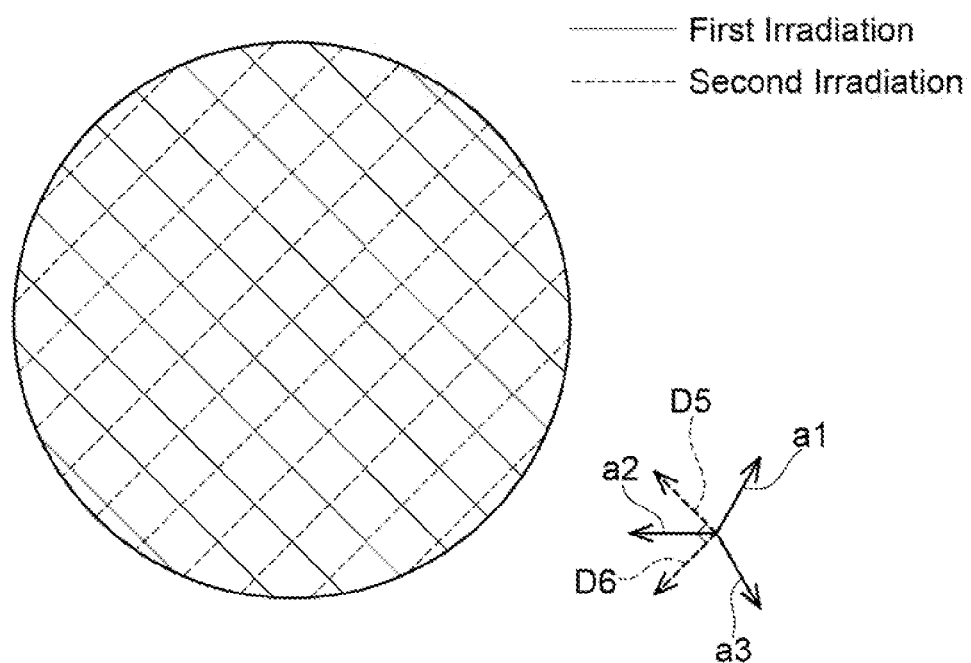
FIG. 12 is a diagram for explaining trajectories according to a modification.

In the above-described embodiment, the scanning with the laser beam 20 is performed along the three directions D1 to D3. Alternatively, for example, as shown in FIG. 12, the scanning with the laser beam 20 may be performed along two directions D5 and D6. In FIG. 12, the direction D5 is substantially perpendicular to the direction D6. The direction D5 is parallel to none of the crystal axes a1 to a3. Similarly, the direction D6 is parallel to none of the crystal axes a1 to a3. Therefore, also in this case, it is possible to cause the support plate 10 to have uniform warpage distribution.

In the above-described embodiment, the crystal structure of the support plate 10 is hexagonal crystal. Alternatively, a single-crystal substrate having a different crystal structure may be used as the support plate 10. Also in this case, it is possible to cause the warpage of the support plate 10 to be uniformly distributed therein by setting directions of the straight lines of the trajectory of the laser beam 20 to directions that are not parallel to any of the crystal axes in a plane parallel to the surface of the support plate 10.

Figure 13:
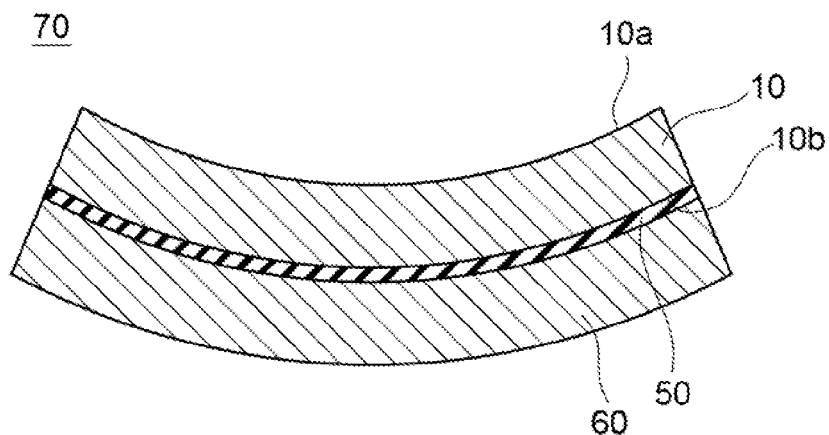
FIG. 13 is a cross-sectional view of a multi-layer substrate 70 after an adhering process according to a modification.
Figure 14:
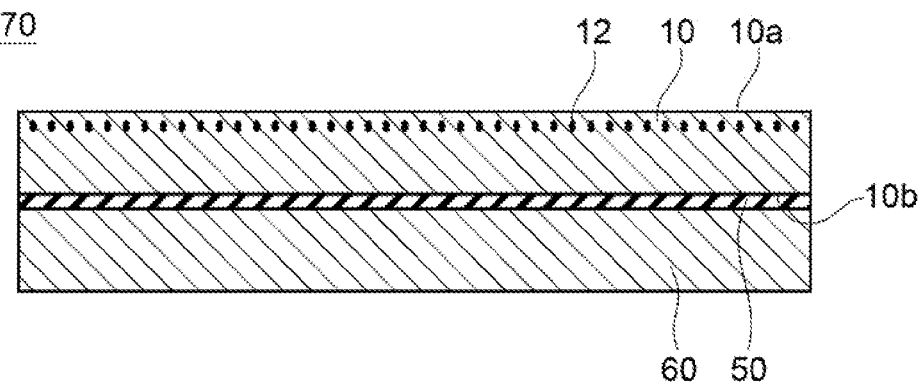
FIG. 14 is a cross-sectional view of the multi-layer substrate 70 after the non-crystalline region forming process according to the modification.

In the above-described embodiment, the adhering process is executed after the non-crystalline region forming process. Alternatively, the non-crystalline region forming process may be executed after the adhering. This case is described hereinafter. When the adhering is executed before the non-crystalline region forming process, a flat semiconductor substrate 60 is adhered to a flat support plate 10 in a similar manner to the above-described embodiment. When a multi-layer substrate 70 is cooled, warpage occurs in the multi-layer substrate 70 as shown in FIG. 13 due to a difference in linear expansion coefficient between the support plate 10 and the semiconductor substrate 60. Since the support plate 10 shrinks at a greater degree than the semiconductor substrate 60 does, the multi-layer substrate 70 warps convexly toward the semiconductor substrate 60 side. Next, an upper surface 10a of the support plate 10 is irradiated with a laser beam 20 in a similar manner to the above-described embodiment to form non-crystalline regions 12. The formation of the non-crystalline regions 12 causes a region near the upper surface 10a of the support plate 10 to expand. Thus, as shown in FIG. 14, the multi-layer substrate 70 is planarized. Also in this method, a flat multi-layer substrate 70 can be obtained.

In the above-described embodiment, the non-crystalline regions 12 are formed in the support plate 10. Alternatively, the non-crystalline regions 12 may be formed so as to be exposed on the surface of the support plate 10.

In the above-described embodiment, the non-crystalline regions 12 are formed by the laser beam 20. Alternatively, the non-crystalline regions 12 may be formed by irradiating the support plate 10 with charged particles by ion injection, ion milling, or the like. In this case, only a narrow range of the surface of the support plate 10 is irradiated with the charged particles by use of a mask plate or the like, and an irradiation point of the charged particles can be moved as described in the above embodiment.

A method for manufacturing a substrate disclosed in this specification has the following configuration.

A method disclosed in this specification comprises irradiating a single crystal substrate with a beam of laser or charged particles while moving an irradiation point of the beam with respect to the single crystal substrate so that a trajectory of the irradiation point on a surface of the single crystal substrate describes a striped pattern of straight lines. Non-crystalline regions are formed in the single crystal substrate along the trajectory. The irradiation is repeated multiple times so that directions of the striped patterns are different from each other among the multiple times of irradiation. The repetition of the irradiation changes warpage of the single crystal substrate. In the irradiation of multiple times, all of directions of the straight lines described in the multiple times of irradiation are not parallel to any of directions of crystal axes of the single crystal substrate in a plane parallel to the surface.

In a method disclosed in this specification, the single crystal substrate may comprise a first surface and a second surface opposite to the first surface. In the irradiation, the non-crystalline regions may be formed in a range closer to the first surface than an intermediate portion of the single crystal substrate in a thickness direction of the single crystal substrate. The method may further comprise adhering a semiconductor substrate to the single crystal substrate in a heated state. The semiconductor substrate may be adhered to the second surface in a case where a linear expansion coefficient of the single crystal substrate is larger than a liner expansion coefficient of the semiconductor substrate, and the semiconductor substrate may be adhered to the first surface in a case where the liner expansion coefficient of the single crystal substrate is smaller than the linear expansion coefficient of the semiconductor substrate.

The irradiation and the adhesion may be executed in any order.

According to the above configuration, warpage that occurs in the semiconductor substrate in the adhesion process can be canceled with warpage that occurs in the single crystal substrate in the irradiation process. Therefore, the multi-layer substrate including the single crystal substrate and the semiconductor substrate can be planarized.

In a method disclosed in this specification, a crystal structure of the single crystal substrate may be hexagonal crystal. The first surface and the second surface may be c-planes.

In a method disclosed in this specification, the irradiation may be repeated three times. An angle between a direction of the striped pattern of the first irradiation and an a1-axis of the single crystal substrate may be angle X1. An angle between a direction of the striped pattern of the second irradiation and an a2-axis of the single crystal substrate may be angle X2. An angle between a direction of the striped pattern of the third irradiation and an a3-axis of the single crystal substrate may be angle X3. A difference between the angle X1 and the angle X2 may be less than 5 degrees. A difference between the angle X2 and the angle X3 may be less than 5 degrees. A difference between the angle X3 and the angle X1 may be less than 5 degrees.

Thus, when the angles X1, X2, and X3 are substantially equal to each other, the support plate can be caused to warp more uniformly (i.e., in a complete round shape).

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A method for manufacturing a substrate, the method comprising:
   irradiating a single crystal substrate with a beam of laser or charged particles while moving an irradiation point of the beam with respect to the single crystal substrate so that a trajectory of the irradiation point on a surface of the single crystal substrate describes a striped pattern of straight lines, and non-crystalline regions being formed in the single crystal substrate along the trajectory,
   wherein
   the irradiation is repeated multiple times so that directions of the striped patterns are different from each other among the multiple times of irradiation, the repetition of the irradiation changes warpage of the single crystal substrate, and in the irradiation of multiple times, all of directions of the straight lines described in the multiple times of irradiation are not parallel to any of directions of crystal axes of the single crystal substrate in a plane parallel to the surface.

2. The method of claim 1, wherein the single crystal substrate comprises a first surface and a second surface opposite to the first surface, in the irradiation, the non-crystalline regions are formed in a range closer to the first surface than an intermediate portion of the single crystal substrate in a thickness direction of the single crystal substrate, and the method further comprises adhering a semiconductor substrate to the single crystal substrate in a heated state, wherein the semiconductor substrate is adhered to the second surface in a case where a linear expansion coefficient of the single crystal substrate is larger than a liner expansion coefficient of the semiconductor substrate, and the semiconductor substrate is adhered to the first surface in a case where the liner expansion coefficient of the single crystal substrate is smaller than the linear expansion coefficient of the semiconductor substrate.

3. The method of claim 2, wherein a crystal structure of the single crystal substrate is hexagonal crystal, and the first surface and the second surface are c-planes.

4. The method of claim 3, wherein the irradiation is repeated three times, an angle between a direction of the striped pattern of the first irradiation and an a1-axis of the single crystal substrate is angle X1, an angle between a direction of the striped pattern of the second irradiation and an a2-axis of the single crystal substrate is angle X2, an angle between a direction of the striped pattern of the third irradiation and an a3-axis of the single crystal substrate is angle X3, a difference between the angle X1 and the angle X2 is less than 5 degrees, a difference between the angle X2 and the angle X3 is less than 5 degrees, and a difference between the angle X3 and the angle X1 is less than 5 degrees.

* * * * *